US007553189B2

(12) United States Patent
Tseng et al.

(10) Patent No.: US 7,553,189 B2
(45) Date of Patent: Jun. 30, 2009

(54) ELECTRICAL SOCKET FOR INTERCONNECTING CAMERA MODULE WITH SUBSTRATE

(75) Inventors: Fu-Yen Tseng, Taipei Hsien (TW); Chia-Wen Liao, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/125,880

(22) Filed: May 22, 2008

(65) Prior Publication Data

US 2009/0104797 A1 Apr. 23, 2009

(51) Int. Cl.
*H01R 13/648* (2006.01)

(52) U.S. Cl. ........................................ 439/607; 439/71

(58) Field of Classification Search .................. 439/71, 439/607

See application file for complete search history.

(56) References Cited

U.S. PATENT DOCUMENTS 7,288,003 B2 * 10/2007 Ono et al. ................... 439/607
2003/0218873 A1 11/2003 Eromaki et al.
2006/0189216 A1 * 8/2006 Yang .......................... 439/680

* cited by examiner

*Primary Examiner*—Tho D Ta
(74) *Attorney, Agent, or Firm*—Zhigang Ma

(57) ABSTRACT

An electrical socket for electrically connecting with a camera module includes a housing, a grounding spring embedded in the housing, a plurality of terminals received in the housing, and a pair of first shields in collaboration with a pair of second shields for substantially enclosing the housing, and a wire embedded in the housing for electrically connecting one of the first shields and the grounding spring. The grounding spring defines a second contacting portion for providing electrical connection between a corresponding ground pad of the camera module and the first shield via the wire, thereby allowing the grounding spring and the first and second shields to prevent external electromagnetic waves from affecting signals communicated between the camera module to a printed circuit board via the wire.

15 Claims, 6 Drawing Sheets

205 200 201 206 207 4 40 41 42 43 44 45 51 5 50 52 53 100 2 21 220 23 22 6 10 14 101 103 1 110 111 102 11 30 3 12

ELECTRICAL SOCKET FOR INTERCONNECTING CAMERA MODULE WITH SUBSTRATE

TECHNICAL FIELD

The present invention relates to an electrical socket, and more particularly, to an electrical socket used for electrically interconnecting a camera module with a substrate such as a printed circuit board (PCB).

BACKGROUND

Following the advancement in recent years of micro-circuitry and multimedia technology, digital cameras are now in common use. High-end portable electronic devices, such as mobile phones and Personal Digital Assistants (PDAs), are being developed to be increasingly multi-functional. Many of these portable electronic devices are popularly equipped with digital cameras for capturing pictures. Accordingly, there is a demand employing camera sockets for connecting camera modules to substrates such as printed circuit boards (PCBs) to achieve the function mentioned above. To facilitate portability, such portable electronic devices tend to be compact, slim, and light. Accordingly, camera sockets incorporated in the portable electronic devices have also been reduced in size and weight, at the same time remaining cost-effective.

However, while the camera module is electrically connected to the PCB via the camera socket, a digital chip or radio frequency (RF) circuit of the other electrical components mounted on the PCB can generate electromagnetic waves. These electromagnetic waves can affect the electrical signals converted from the camera module to the PCB, thereby impacting the image transmitted to a display unit, such as an LCD.

What is needed, therefore, is an electrical socket that can prevent external electromagnetic waves from affecting the conversion of its electrical signals.

SUMMARY

In accordance with a present embodiment, an electrical socket for electrically connecting a camera module with a printed circuit board (PCB) includes an insulative housing comprising an upper receiving cavity for receiving the camera module therein, a grounding spring embedded in the housing, a plurality of terminals received in the housing, and a pair of first shields in collaboration with a pair of second shields for substantially enclosing the housing, the first shield and the second shield soldered to each other via a laser beam, and a wire embedded in the housing for electrically connecting one of the first shields and the grounding spring. Each terminal has a retaining portion secured in the housing, a first soldering portion soldered on the PCB, and a first contacting portion extending into the receiving cavity of the housing for electrically engaging with a corresponding signal pads of the camera module. Each of the first and second shields defines a pair of second soldering portions, coplanar with the first soldering portion of the terminal and soldered onto the PCB. The grounding spring defines a second contacting portion for providing an electrical connection between a corresponding ground pad of the camera module and the first shield via the wire, thereby allowing the electrical socket to prevent external electromagnetic waves generated by the other components soldered on the PCB from affecting electrical signals converted between the camera module and the PCB.

Other advantages and novel features will be drawn from the following detailed description of at least one preferred embodiment, when considered in conjunction with the attached drawings.

BRIEF DESCRIPTION OF THE DRAWINGS

Many aspects of the present electrical socket can be better understood with reference to the following drawings. The components in the drawings are not necessarily drawn to scale, the emphasis instead being placed upon clearly illustrating the principles of the electrical socket. Moreover, in the drawings, like reference numerals designate corresponding parts throughout the several views.

DESCRIPTION OF EMBODIMENTS

Embodiments of the present electrical socket will now be described in detail below with reference to the drawings.

Figure 1:
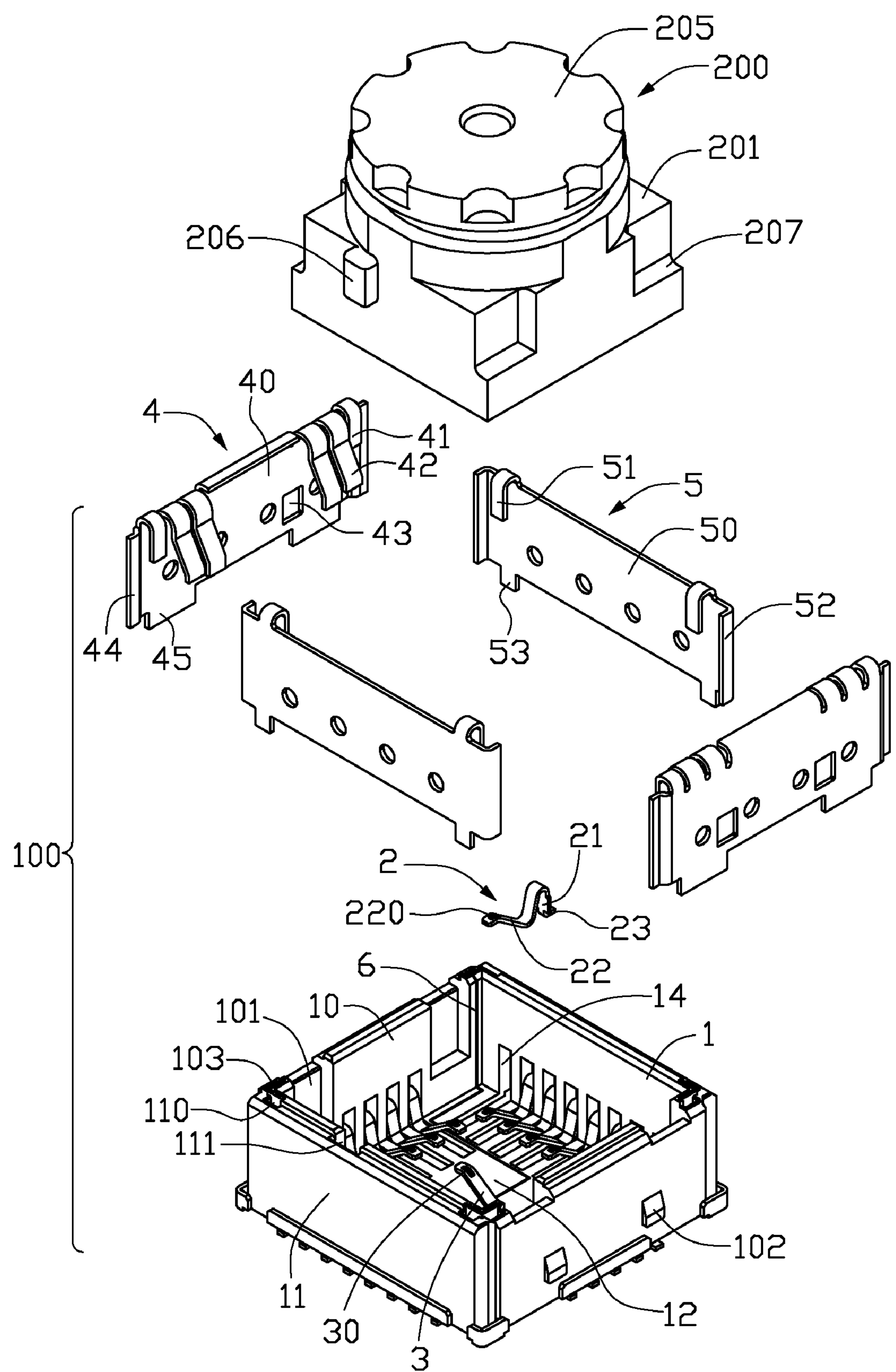
FIG. 1 is an exploded, perspective view of an electrical socket and a camera module in accordance with a first embodiment.
Figure 2:
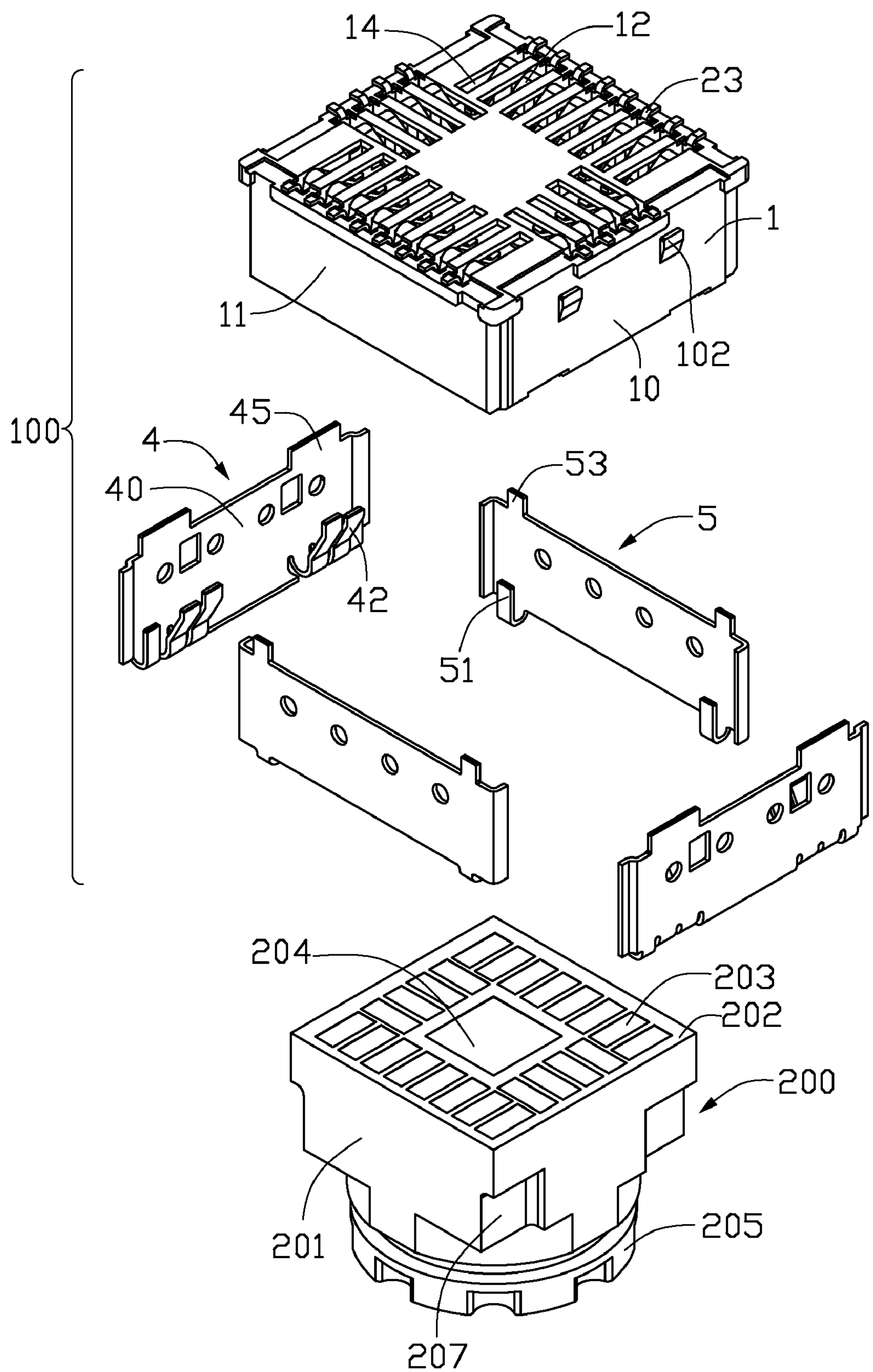
FIG. 2 is similar to FIG. 1, but inverted.
Figure 3:
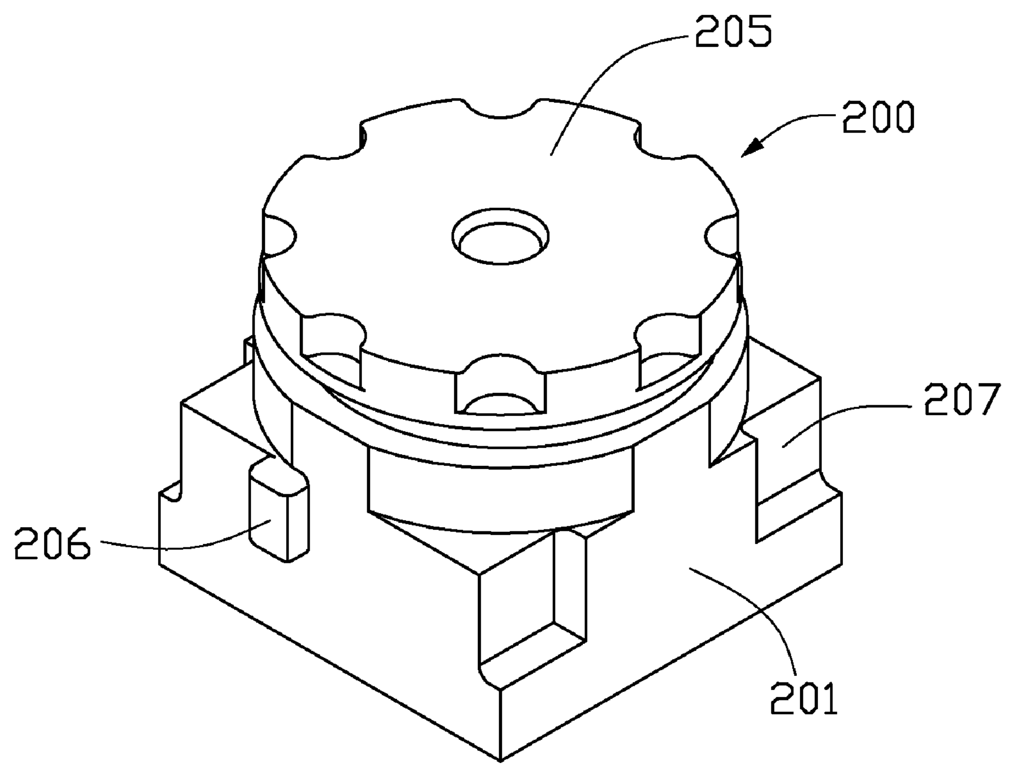
FIG. 3 is an assembled view of the electrical socket of FIG. 1.
Figure 3:
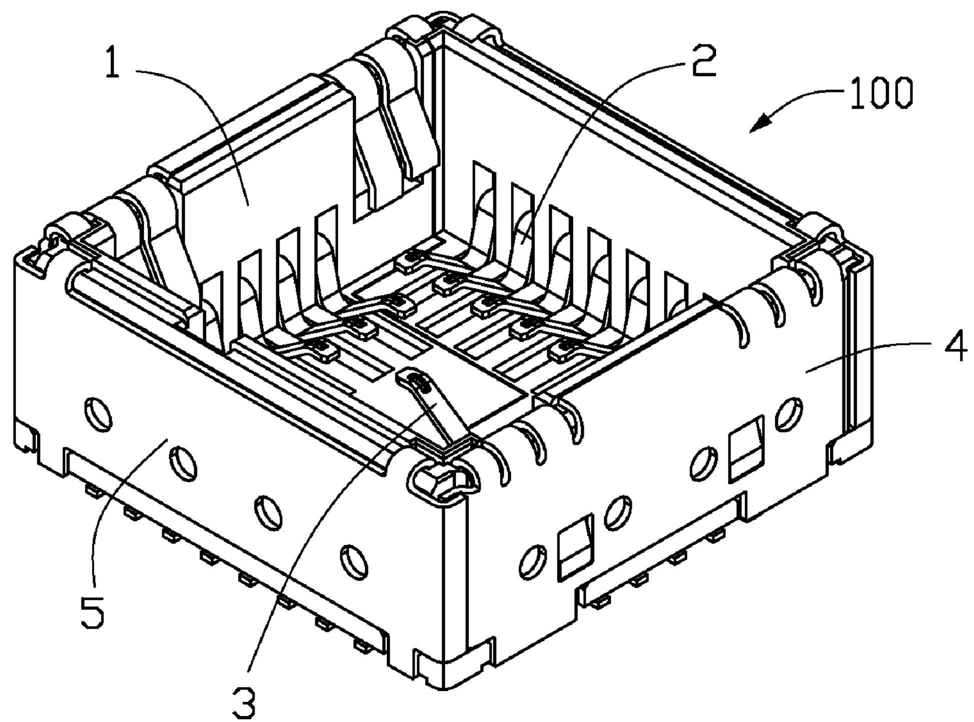
Figure 4:
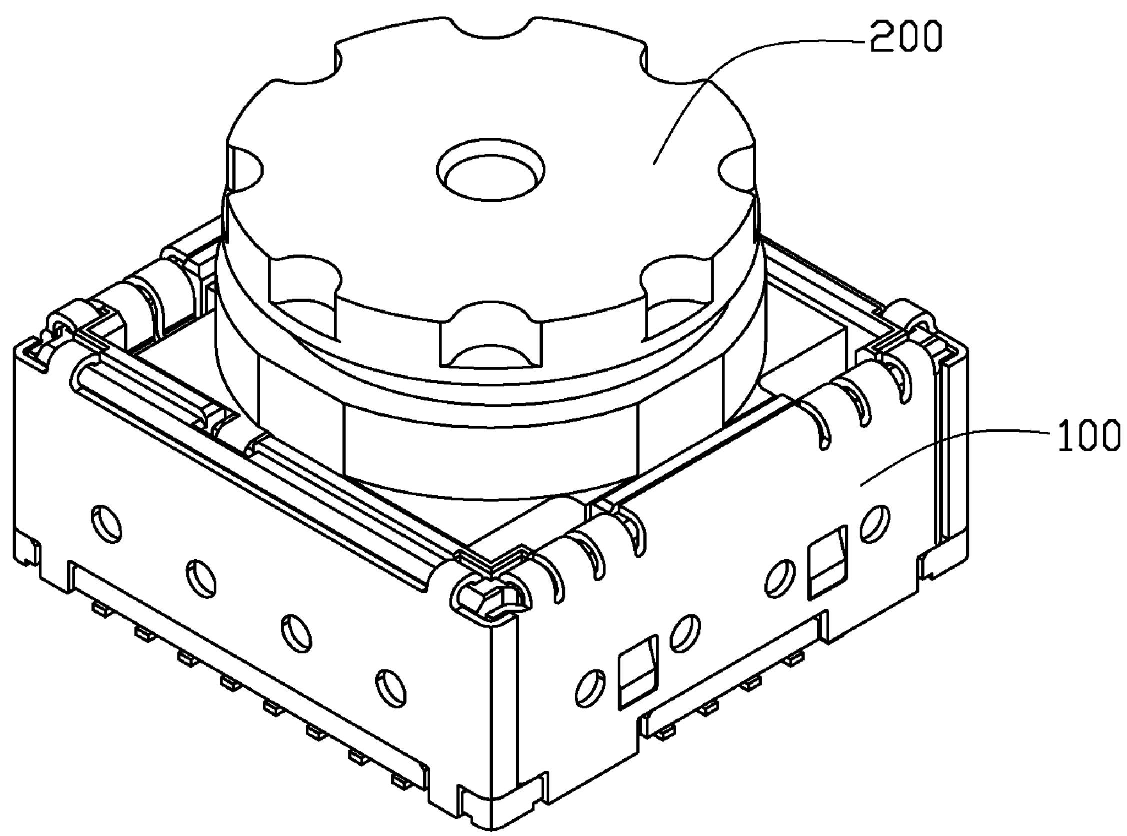
FIG. 4 is an assembled view of FIG. 1.

Referring to FIGS. 1-2, an electrical socket 100 for electrically connecting a camera module 200 to a printed circuit board (PCB) (not shown), in accordance with a first embodiment, includes an insulative housing 1, a plurality of terminals 2 received in the housing 1, a grounding spring 3 embedded in the housing 1, and a pair of first shields 4 in collaboration with a pair of second shields 5 for substantially enclosing the housing 1, and a wire 6 embedded in the housing 1 for electrically connecting one of the first shields 4 and the grounding spring 3.

The housing 1 comprises a pair of opposite first sidewalls 10, a pair of opposite second sidewalls 11 connected to the first sidewalls 10, and a bottom wall 12 connected to the first and second sidewalls 10, 11. The first and second sidewalls 10, 11 and the bottom wall 12 collaboratively provide an upper receiving cavity (not labeled) for receiving the camera module 200 therein. A plurality of passageways 14 respectively extends from the first and second sidewalls 10, 11 to the bottom wall 12 to form an L-shaped configuration for receiving the corresponding terminals 2 therein. The passageway 14 defines a vertical portion (not labeled) formed in the first and second sidewalls 10, 11 and a horizontal portion (not labeled) formed in the bottom wall 12. Each of the first sidewalls 10 define a pair of first recesses 103 on an upper portion at opposite ends thereof, and a pair of first slots 101 extending from the upper portion to a lower inner portion and formed between the first recesses 103, and a pair of blocks 102 extending outwards from a lower outer portion thereof. Each of the second sidewalls 11 also defines a pair of second recesses 110 on an upper portion at opposite ends thereof, and a second slot 111 extending from the upper portion to a lower inner portion and formed between the second recesses 110.

The terminal 2 comprises a base portion 21 received in the vertical portion of the passageway 14, a spring arm 22 extending outwards slantwise from one end of the base portion 21 to form an acute angle between the spring arm 22 and the base portion 21, and a first soldering portion 23 extending horizontally from the other end of the base portion 21 and received in the horizontal portion of the passageway 14. The spring arm 22 defines a first contacting portion 220 at a distal end thereof for electrically connecting with the corresponding signal pad of the camera module 200.

The grounding spring 3 is embedded in the bottom wall 12 of the housing 1, and defines a second contacting portion 30 formed on an end thereof. The second contacting portion 30 is coplanar with the first contacting portion 220 of the terminal 2 and electrically connected to the corresponding grounding pad of the camera module 200.

Each of the first shields 4 is formed by bending a punched metal plate and defines a first wall 40 for enclosing the corresponding first sidewall 10 of the housing 1, a pair of L-shaped first retaining tabs 41 formed on an upper portion thereof to be received in the corresponding first recesses 103 of the first sidewall 10, two pairs of retaining members 42 extending downwards slantwise to the receiving cavity of the housing 1 from the upper portion thereof so as to be received in the corresponding first slots 101 of the housing 1. The first shield 4 also defines a pair of holes 43 formed on a lower portion thereof to receive the corresponding blocks 102 of the housing 1, a pair of second soldering portions 45 formed on a bottom portion thereof, and a pair of first pieces 44 formed on two opposite ends of the first wall 40.

The second shield 5 is also formed by bending a punched metal plate and defines a second wall 50 for enclosing the corresponding second sidewall 11 of the housing 1, a pair of L-shaped second retaining tabs 51 formed on an upper portion thereof to be received in the corresponding second recesses 110 of the second sidewall 11, a pair of second pieces 52 formed on two opposite ends of the second wall 50 to solder with the first pieces 44 of the first shield 4 by laser beam, and a pair of second soldering portions 53 formed on a bottom portion thereof. The second soldering portions 45, 53 of the first and second shields 4, 5 are coplanar with the first soldering portion 23 of the terminal 2.

The camera module 200 comprises a rectangular base 201, a columned protrusion 205 extending upward from a center of the base 201. The base 201 defines an anti-mismating block 206 formed at a side thereof to be received in the second slot 111 of the housing 1, and a plurality of engagement portions 207 formed at each corner of a square upper surface (not labeled) by cutting to engage with the corresponding retaining members 42 of the first shield 4 when the camera module 200 is inserted into the receiving cavity of the housing 1. Furthermore, the base 201 also defines a plurality of signal pads 203 provided on a bottom surface 202 thereof, and a grounding pad 204 formed in the middle of the bottom surface 202 around by the signal pads 203. The signal pad 203 is electrically connected to the first contacting portion 220 of the terminal 2, while the grounding pad 204 is electrically connected to the second contacting portion 30 of the grounding spring 3.

Referring to FIGS. 1-4, before in assembly, the grounding spring 3 and the wire 6 are embedded in the housing 1 during insert-molding the housing 1. At this state, one end of the wire 6 is extended into one of the first recesses 103, and the other end of the wire 6 is connected with the grounding spring 3. Initially, the terminals 2 are assembled to the housing 1 from a bottom surface of the housing 1. The base portion 21 is interferentially received in the vertical portion of the L-shaped passageway 14, the spring arm 22 extends into the receiving cavity and the first soldering portion 23 extends out of the bottom wall 12 of the housing 1, thereby securing the terminals 2 in the housing 1. Secondly, the pair of first shields 4 is attached onto the pair of first sidewalls 10 of the housing 1, the first retaining tabs 41 are pressed into the first recesses 103 of the housing 1, and the holes 43 engaged with the corresponding block 102 of the housing 1, whereby the first shield 4 surrounds the outer periphery of the first sidewall 10. Furthermore, the second shield 5 is also attached onto the second sidewall 11 of the housing 1 via the second retaining tabs 51 interferentially engaged with the second recesses 110. Thus, the electrical socket 1 has been completely assembled.

Thirdly, the camera module 200 is disposed in the receiving cavity of the housing 1, the retaining member 42 of the first shield 4 and the spring arm 22 of the terminal 2 will alter their shapes to respectively engage with the corresponding engagement portion 207 and the signal pad 203 of the camera module 200, while the second contacting portion 30 of the grounding spring 3 is also electrically connected with the grounding pad 204 of the camera module 200. Lastly, the first soldering portion 23 of the terminal 2 and the second soldering portions 45, 53 of the first and second shields 4, 5 are soldered onto a printed circuit board (PCB), thereby allowing the grounding spring 3 and the first and second shields 4, 5 to prevent external electromagnetic waves generated by the other components soldered on the PCB from affecting electrical signals communicated between the camera module 200 to the PCB via the wire 6.

Figure 5:
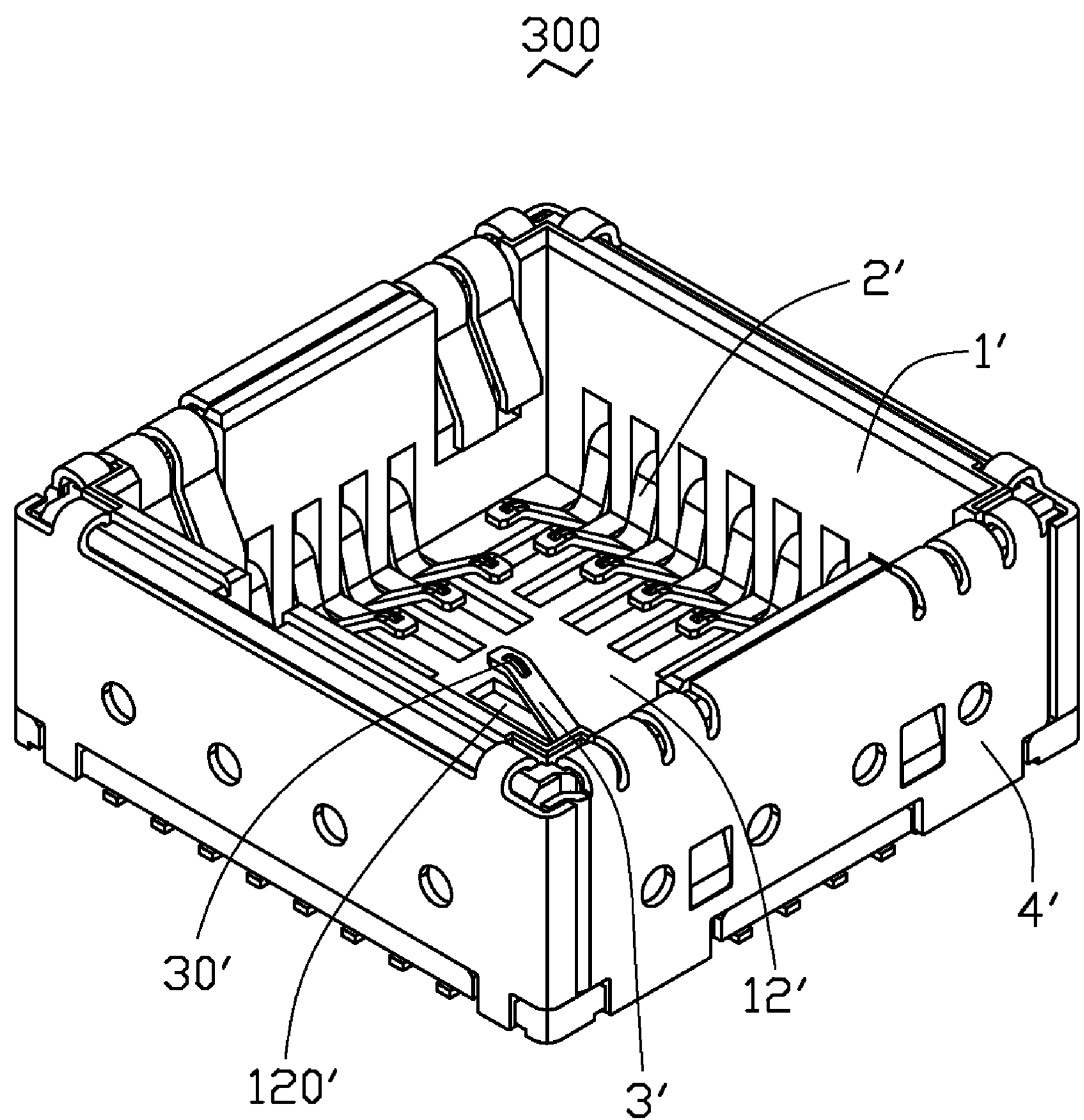
FIG. 5 is a perspective view of an electrical socket in accordance with a second embodiment.
Figure 6:
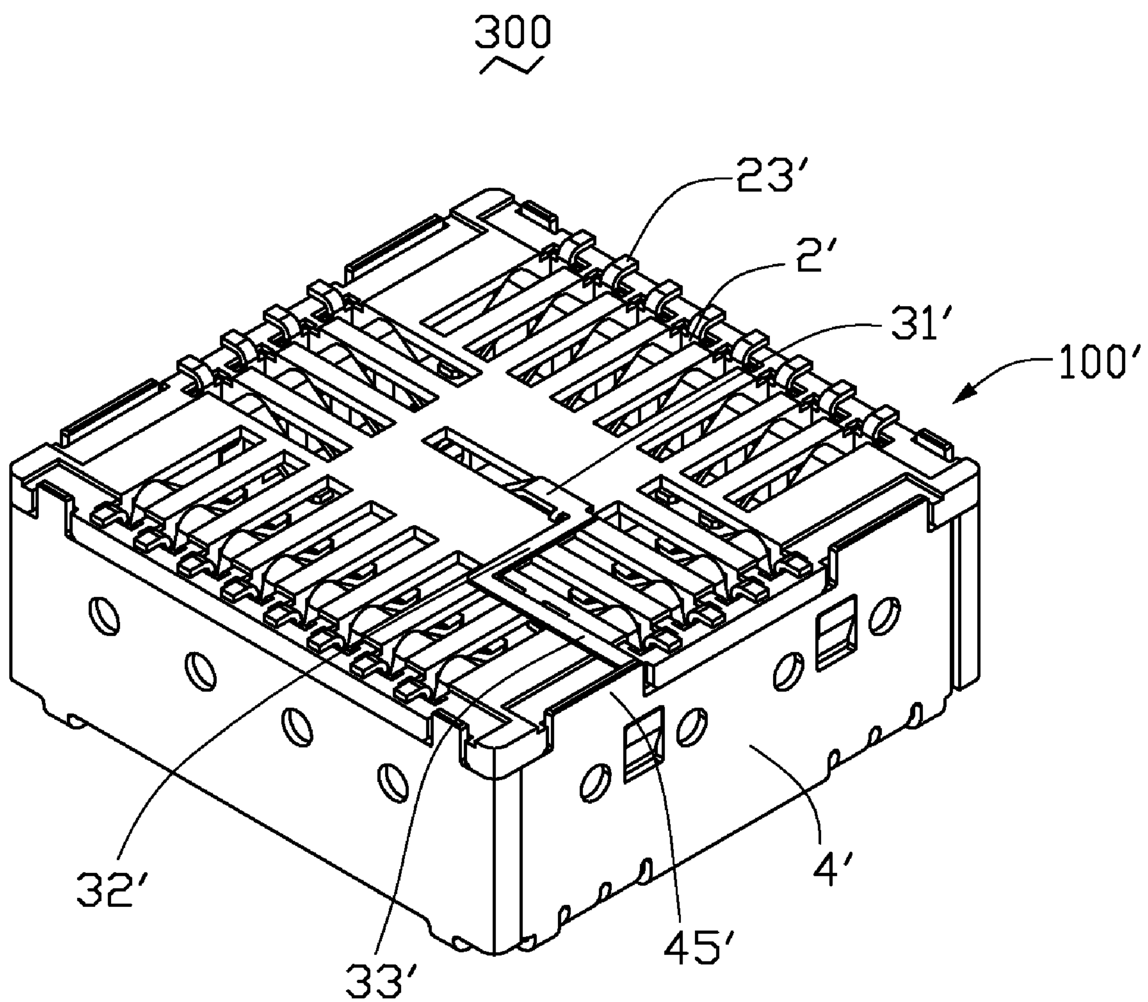
FIG. 6 is similar to FIG. 5, but inverted.

Referring to FIGS. 5-6, an electrical socket 300, in accordance with a second embodiment, is similar to the electrical socket 100 of the first embodiment. In this embodiment, the bottom wall 12' of the housing 1' defines a receiving slot 120' formed near the passageways (not labeled). The grounding spring 3' is not embedded in the bottom wall 12' of the housing 1', but is received in the receiving slot 120' of the housing 1'. The grounding spring 3' further comprises a securing portion 31' secured in the receiving slot 120', a connecting portion 32' connecting with the securing portion 31', and a tail 33' in addition to the second contacting portion 30'. The tail 33' is soldered on a side of the second soldering portion 45' of the first shield 4', while a bottom surface of the second soldering portion 45' of the first shield 4', together with the first soldering portion 23' of the terminal 2', is soldered on the PCB. Other configurations of the second embodiment are the same as that of the first embodiment, and so are not described in detail.

In the electrical sockets, the grounding spring is electrically connecting the corresponding grounding pad of the camera module to one of the first shields. Therefore, external electromagnetic waves generated by the other components soldered on the PCB can be grounded via the grounding spring.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical socket adapted for electrically connecting a camera module to a printed circuit board, comprising:

an insulative housing defining a pair of first sidewalls, a pair of second sidewalls, a bottom wall and a receiving cavity surrounded by the first, second sidewalls and the bottom wall, for receiving the camera module therein;

a plurality of terminals received in the insulative housing for electrically connecting to corresponding signal pads of the camera module;

a pair of first shields assembled to the first sidewalls of the housing;

a pair of second shields assembled to the second sidewalls of the housing, and the first shields connecting to the second shields;

a grounding spring engaged with the bottom wall of the housing for electrically connecting to the camera module and at least one of the first and second shields;

wherein the grounding spring and the first and second shields can prevent external electromagnetic waves from affecting electrical signals communicated between the camera module to the printed circuit board.

2. The electrical socket as claimed in claim 1, wherein the grounding spring is embedded in the bottom wall of the housing.

3. The electrical socket as claimed in claim 2, wherein a wire is embedded in the housing for electrically connecting one of the first shield and the grounding spring.

4. The electrical socket as claimed in claim 1, wherein the grounding spring is received in the bottom wall of the housing and comprises a securing portion, a connecting portion and a tail soldered on a side of one of the first shields.

5. The electrical socket as claimed in claim 4, wherein the bottom wall of the housing defines a receiving slot for receiving the securing portion of the grounding spring.

6. The electrical socket as claimed in claim 1, wherein the housing defines a plurality of passageways respectively extending from the first and second sidewalls to the bottom wall to form an L-shaped configuration for receiving the corresponding terminals therein, the passageway defining a vertical portion formed in the first and second sidewalls and a horizontal portion formed in the bottom wall.

7. The electrical socket as claimed in claim 6, wherein each terminal comprises a base portion received in the vertical portion of the passageway, a spring arm extending outwards slantwise from one end of the base portion to form an acute angle between the spring arm and the base portion, and a first soldering portion extending horizontally from the other end of the base portion and received in the horizontal portion of the passageway, the spring arm defining a first contacting portion at a distal end thereof for electrically connecting with the corresponding signal pad of the camera module.

8. The electrical socket as claimed in claim 1, wherein each of the first and second shields defines a wall for respectively enclosing the corresponding first and second sidewalls of the housing, a pair of L-shaped first retaining tabs formed on an upper portion thereof.

9. The electrical socket as claimed in claim 8, wherein the first shield defines two pairs of retaining members extending downwards slantwise to the receiving cavity of the housing from the upper portion thereof.

10. The electrical socket as claimed in claim 9, wherein each of the first and second sidewalls defines a pair of first recesses at opposite ends thereof for engaging with the corresponding retaining tabs of the first and second shields, and a pair of first slots extending from the upper portion to a lower inner portion and formed between the first recesses for engaging with the corresponding retaining members of the first shield.

11. The electrical socket as claimed in claim 1, wherein each of the first and second shields defines a pair of pieces formed on two opposite ends thereof to solder each other by laser beam, and a pair of second soldering portions formed on a bottom portion thereof.

12. The electrical socket as claimed in claim 11, wherein a first soldering portion of the terminal are coplanar with the second soldering portions of the first and second shields.

13. The electrical socket as claimed in claim 1, wherein the camera module comprises a rectangular base, a columned protrusion extending upwardly from a center of the base.

14. The electrical socket as claimed in claim 13, wherein the base defines an anti-mismating block formed at a side thereof to be received in the housing, and a plurality of engagement portions formed at each corner of a square upper surface by cutting to engage with the corresponding retaining members of the first shield.

15. The electrical socket as claimed in claim 14, wherein the base defines a plurality of signal pads provided on a bottom surface thereof, and a grounding pad formed in the bottom surface around by the signal pads, the signal pad electrically connected to a first contacting portion of the terminal, while the grounding pad electrically connected to a second contacting portion of the grounding spring.

* * * * *